(12) United States Patent
Chen et al.

(10) Patent No.: US 11,670,748 B2
(45) Date of Patent: Jun. 6, 2023

(54) LED PACKAGE STRUCTURE

(71) Applicant: Lextar Electronics Corporation, Hsinchu (TW)

(72) Inventors: Chang-Han Chen, Hsinchu (TW); Chun-Peng Lin, Hsinchu (TW); Lung-Kuan Lai, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 51 days.

(21) Appl. No.: 17/195,539

(22) Filed: Mar. 8, 2021

(65) Prior Publication Data

US 2021/0288233 A1 Sep. 16, 2021

(30) Foreign Application Priority Data

Mar. 11, 2020 (CN) .......................... 202010165904.5

(51) Int. Cl.
| | | |
|---|---|---|
| *H01L 33/60* | (2010.01) | |
| *H01L 33/48* | (2010.01) | |
| *H01L 33/58* | (2010.01) | |
| *H01L 33/62* | (2010.01) | |

(52) U.S. Cl.
CPC ............ *H01L 33/60* (2013.01); *H01L 33/486* (2013.01); *H01L 33/58* (2013.01); *H01L 33/62* (2013.01)

(58) Field of Classification Search
CPC ............................. H01L 33/60; H01L 33/486
See application file for complete search history.

(56) References Cited

U.S. PATENT DOCUMENTS

2018/0195677 A1 7/2018 Konagayoshi et al.

FOREIGN PATENT DOCUMENTS

| CN | 103137833 | A | | 6/2013 |
|---|---|---|---|---|
| CN | 104851904 | A | | 8/2015 |
| CN | 105845814 | A | * | 8/2016 |
| CN | 105845814 | A | | 8/2016 |
| CN | 205692861 | U | | 11/2016 |
| CN | 106449542 | A | * | 2/2017 |
| CN | 106449542 | A | | 2/2017 |
| CN | 206098446 | U | | 4/2017 |
| CN | 109509825 | A | | 3/2019 |
| CN | 209150148 | U | | 7/2019 |
| EP | 2472613 | A1 | | 7/2012 |
| JP | 2004146466 | A | | 5/2004 |
| JP | 2006269485 | A | | 10/2006 |
| JP | 2006269485 | A | * | 10/2006 |
| KR | 20130059875 | A | | 6/2013 |
| TW | 200746466 | A | | 12/2007 |
| TW | 201323316 | A1 | | 6/2013 |
| TW | M544124 | U | | 6/2017 |
| TW | 201813122 | A | | 4/2018 |

(Continued)

*Primary Examiner* — Antonio B Crite
(74) *Attorney, Agent, or Firm* — CKC & Partners Co., LLC

(57) ABSTRACT

A light emitting diode (LED) package structure includes a circuit board, a reflective cup, a LED chip and a lens structure. The reflective cup is mounted on the circuit board, wherein the reflective cup and the circuit board collectively form a concave cup with an opening. The reflective cup has a first metal ring in the concave cup. The LED chip is mounted on the circuit board and within the concave cup. The lens structure has a second metal ring configured to join the first metal ring to cover the opening.

14 Claims, 8 Drawing Sheets

100b

(56) References Cited

FOREIGN PATENT DOCUMENTS

| TW | I649902 B | 2/2019 |
| TW | I659544 B | 5/2019 |
| WO | 2009132837 A2 | 11/2009 |
| WO | 2010063173 A1 | 6/2010 |
| WO | WO-20190235900 A1 * | 12/2019 |

* cited by examiner

LED PACKAGE STRUCTURE

CROSS-REFERENCE TO RELATED APPLICATION

This application claims priority to China Application Serial Number 202010165904.5, filed Mar. 11, 2020, which is herein incorporated by reference in its entirety.

BACKGROUND

Field of Invention

The present disclosure relates to a light emitting diode (LED) package structure.

Description of Related Art

Light emitting diode is a light-emitting element made of semiconductor material that can convert electrical energy into light. It has the advantages of small size, high energy conversion efficiency, long life, power saving, etc., so it can be widely used as light source in various electronic applications.

When a ceramic substrate and a quartz lens are utilized to package a light-emitting diode, it is easy to cause defects such as uneven electrode pads or poor eutectic bonding, and it is difficult to optimize its optical performance. Therefore, it is an urgent need for various suppliers to overcome these problems.

SUMMARY

One aspect of the present disclosure is to provide a light emitting diode (LED) package structure includes a circuit board, a reflective cup, a LED chip and a lens structure. The reflective cup is mounted on the circuit board, wherein the reflective cup and the circuit board collectively form a concave cup with an opening. The reflective cup has a first metal ring in the concave cup. The LED chip is mounted on the circuit board and within the concave cup. The lens structure has a second metal ring configured to join the first metal ring to cover the opening.

In one or more embodiments, a bottom surface of the reflective cup has a third metal ring, and the circuit board has a fourth metal ring configured to join the third metal ring.

In one or more embodiments, the LED package structure further includes a metal paste or a glass paste filled between the first and second metal rings, and disposed between the third and fourth metal rings.

In one or more embodiments, the LED package structure further includes a polymer adhesive filled between the first and second metal rings, and disposed between the third and fourth metal rings.

In one or more embodiments, the first metal ring and the third metal ring are connected to each other and have substantially the same diameter.

In one or more embodiments, the LED package structure further includes another pair of first and second metal rings with a different diameter configured to secure the lens structure to the reflective cup.

In one or more embodiments, the LED package structure further includes a polymer adhesive filled between the another pair of first and second metal rings.

In one or more embodiments, the LED package structure further includes another pair of third and fourth metal rings with a different diameter configured to secure the reflective cup to the circuit board.

In one or more embodiments, the LED package structure further includes a polymer adhesive disposed between the another pair of third and fourth metal rings.

In one or more embodiments, the circuit board has a stage on which the LED chip is mounted, a top of the stage is higher than an interface between the reflective cup and the circuit board.

In one or more embodiments, the lens structure comprises a flat lens or a convex lens.

In one or more embodiments, the lens structure is embedded in the concave cup.

In one or more embodiments, the first, second, third and fourth metal rings are continuously closed metal rings.

In one or more embodiments, the first, second, third and fourth metal rings are discontinuous metal rings.

In one or more embodiments, an inner surface of the concave cup has a light reflective coating.

In summary, the LED package structure disclosed herein adopts a multi-piece combination design and joins the components with metal rings to address the issue of uneven substrates and increase the eutectic bonding yield. The LED package structure can be applied to a variety of substrates and various types of permeable environments to increase design flexibility. In addition, the metal ring can prevent the bonding material from being attacked by the high-energy light of the LED.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
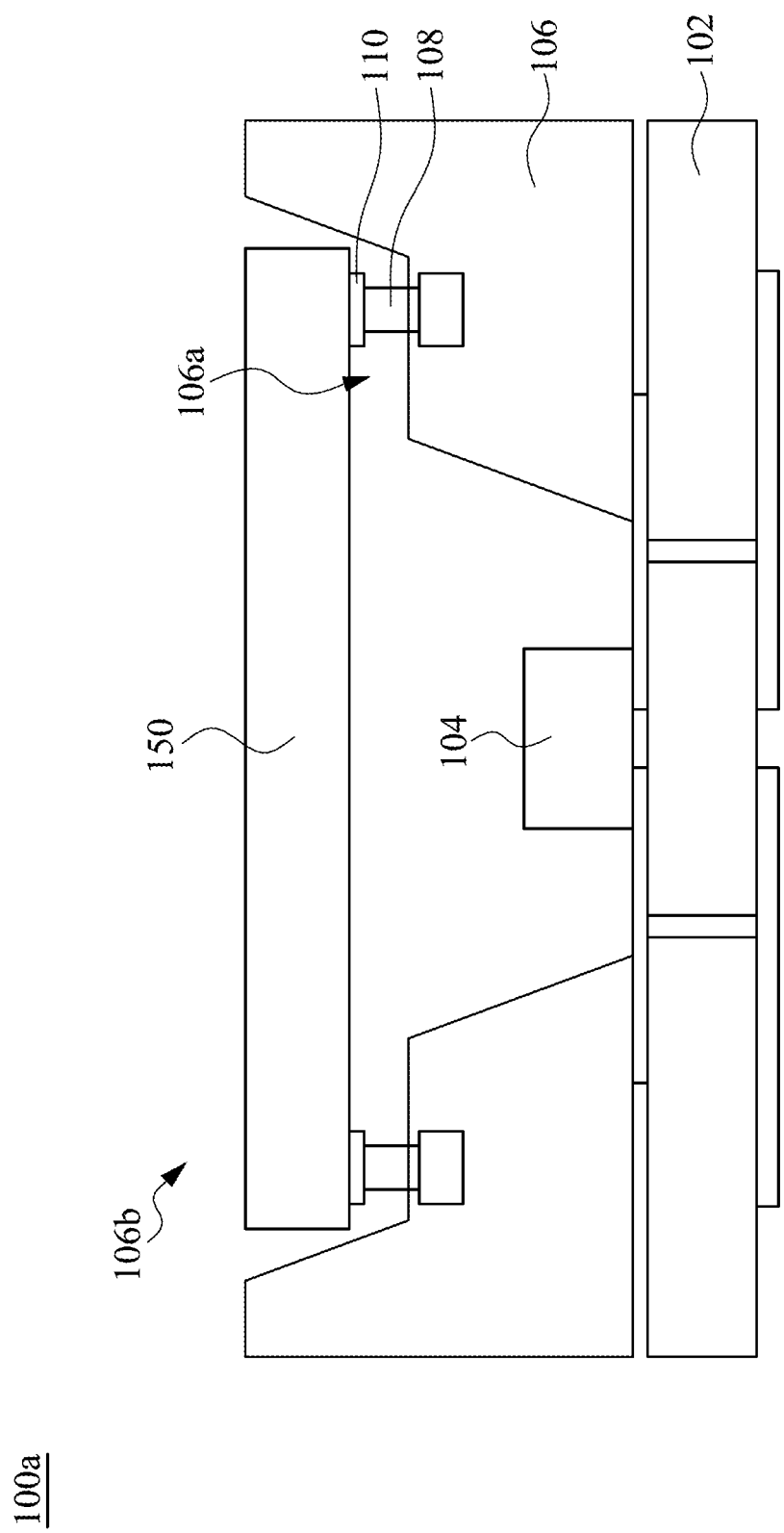
FIG. 1 illustrates a cross-sectional view of an LED package structure in accordance with a first embodiment of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not necessarily be drawn to scale, and the identical elements of the embodiments are designated with the same reference numerals.

Reference is made to FIG. 1, which illustrates a cross-sectional view of an LED package structure in accordance with a first embodiment of the present disclosure. The LED package structure 100a includes a circuit board 102, a reflective cup 106, an LED chip 104, and a lens structure 150. The reflective cup 106 is located on the circuit board 102 and forms a concave cup with an opening 106b together with the circuit board 102. The reflective cup 106 has a first metal ring 108 located in the concave cup. The LED chip 104 is die-bonded on the circuit board 102 and within the concave cup. The lens structure 150 has a second metal ring 110 for joining the first metal ring 108 to cover the opening 106b.

In this embodiment, the reflective cup 106 can be made of polymers such as PE, PT, PC, PMMA, Teflon and other plastic and rubber products, or ceramics such as $Al_2O_3$, AlN, $ZrO_2$ . . . or metals such as iron, aluminum, copper, stainless steel, or other alloys, but not being limited thereto.

In this embodiment, the material of the metal ring may be metal (for example, copper, nickel, gold, silver) or its alloy (for example, gold-tin alloy, nickel-tin alloy, tin-silver-copper alloy, iron-cobalt-nickel alloy, etc.), but not being limited thereto. The metal ring surface coating may be gold-plated (such as palladium, nickel, or other metals), or metal oxide or nitride (such as $TiO_2$, TiN, or other oxides such as $SiO_2$, BN . . . ), and can also be coated with an oxide layer, such as OSP (Organic Solderability Preservative), organic solder mask and similar materials, but not being limited thereto.

In this embodiment, the lens structure 150 may be a transparent material corresponding to the wavelength, such as glass, quartz, sapphire, calcium fluoride, or may be an organic material such as PC, PMMA, etc., but not being limited thereto.

In this embodiment, the lens structure 150 is a flat lens, but not being limited thereto.

In this embodiment, a bonding material filled between the metal rings may be inorganic materials such as metal paste (such as solder paste, gold and solder paste), glass paste, or polymer materials such as epoxy resin and silicone.

Figure 2:
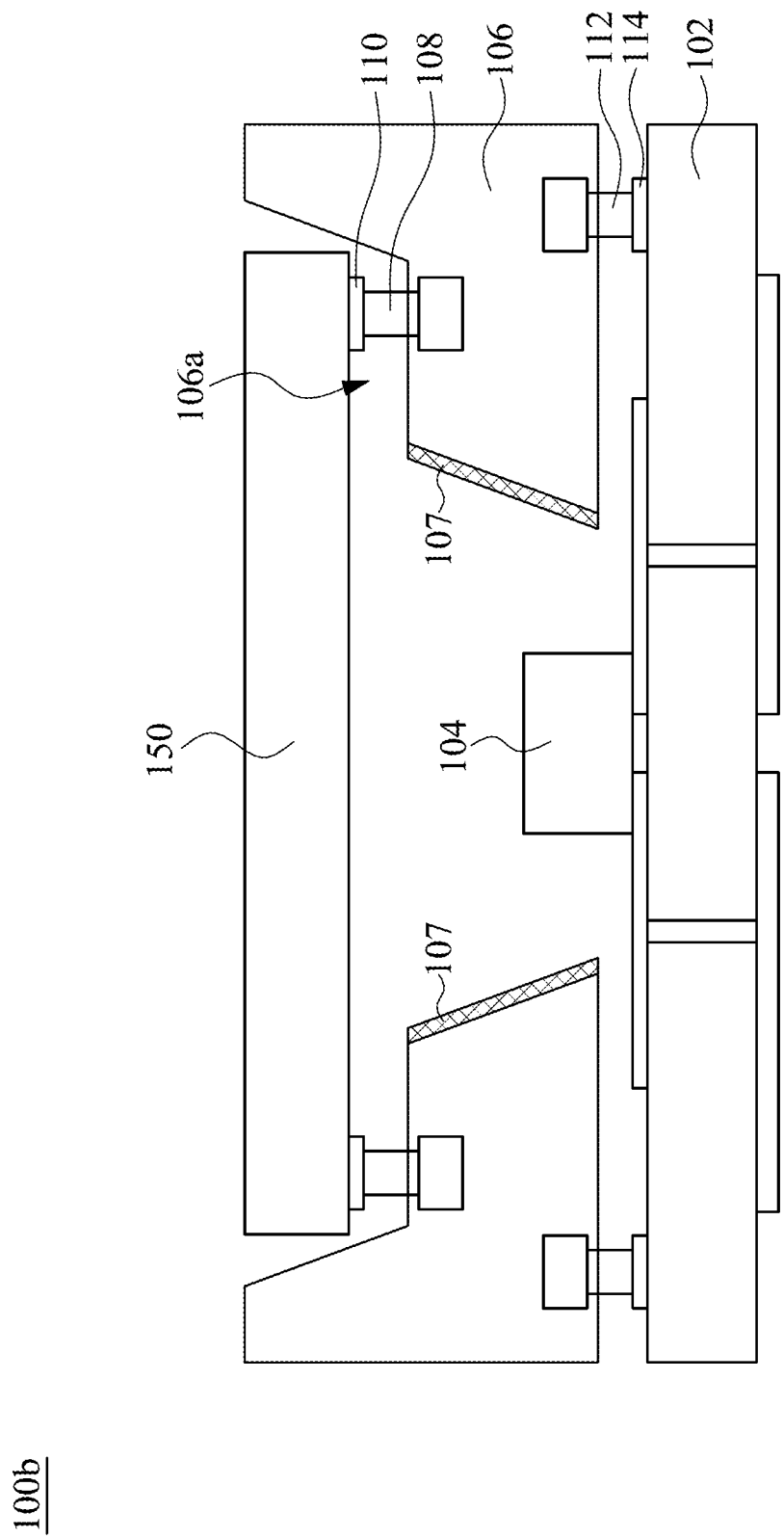
FIG. 2 illustrates a cross-sectional view of an LED package structure in accordance with a second embodiment of the present disclosure.

Reference is made to FIG. 2, which illustrates a cross-sectional view of an LED package structure in accordance with a second embodiment of the present disclosure. Compared with the aforementioned LED package structure 100a, the LED package structure 100b adds metal rings (112, 114). A bottom surface of the reflective cup 106 has a third metal ring 112, and a top surface of the circuit board 102 has a fourth metal ring 114 for joining the third metal ring 112. An inclined inner surface of the reflective cup 106 has a light reflective coating 107. In this embodiment, the light reflective coating 107 includes a metal reflective layer (such as aluminum, silver or gold layers, etc.), and its outermost layer can be coated with oxide (such as $TiO_2$, $SiO_2$, etc.) for protecting the metal reflective layer underneath, but not being limited thereto.

Figure 3:
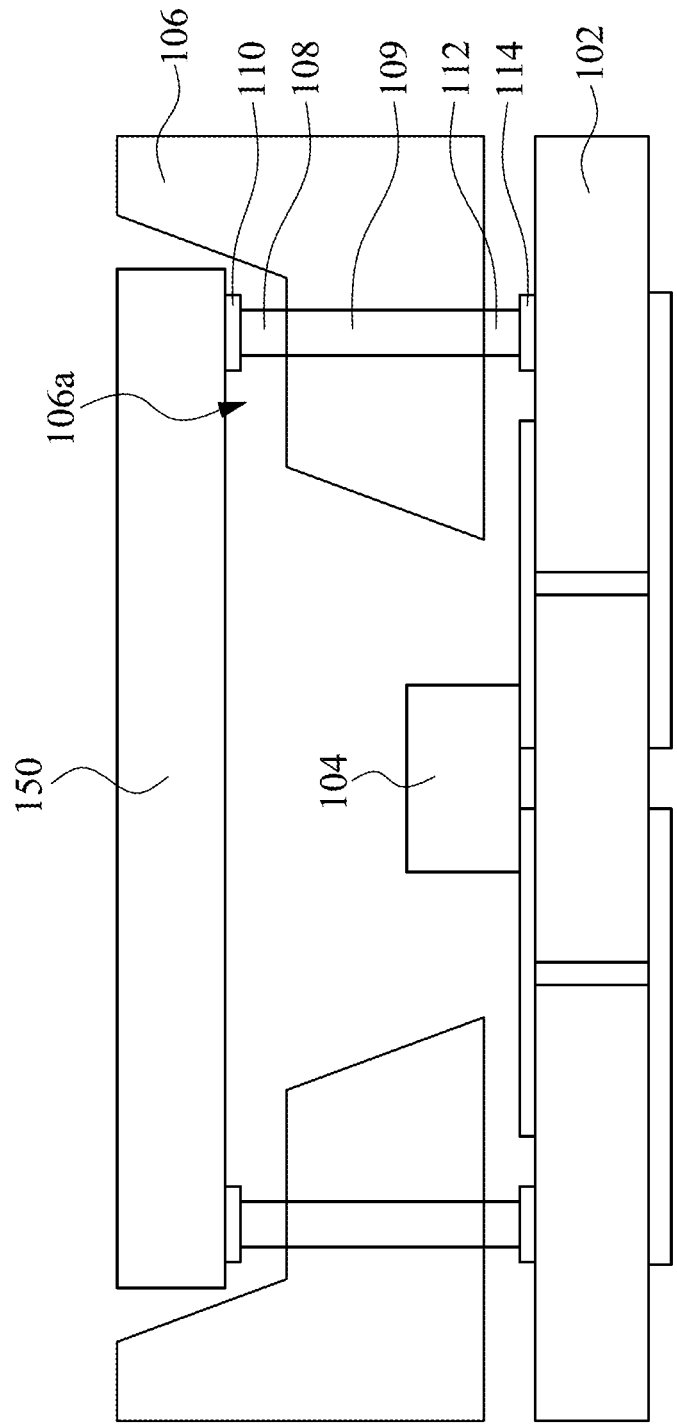
FIG. 3 illustrates a cross-sectional view of an LED package structure in accordance with a third embodiment of the present disclosure.

Reference is made to FIG. 3, which illustrates a cross-sectional view of an LED package structure in accordance with a third embodiment of the present disclosure. The difference between the LED package structure 100c and the aforementioned LED package structure 100b is that the first and third metal rings (108, 112) are integrally formed, or the first and third metal rings (108, 112) are connected by a connection ring 109. And the diameters of all rings (108, 109, 112) are the same.

Figure 4:
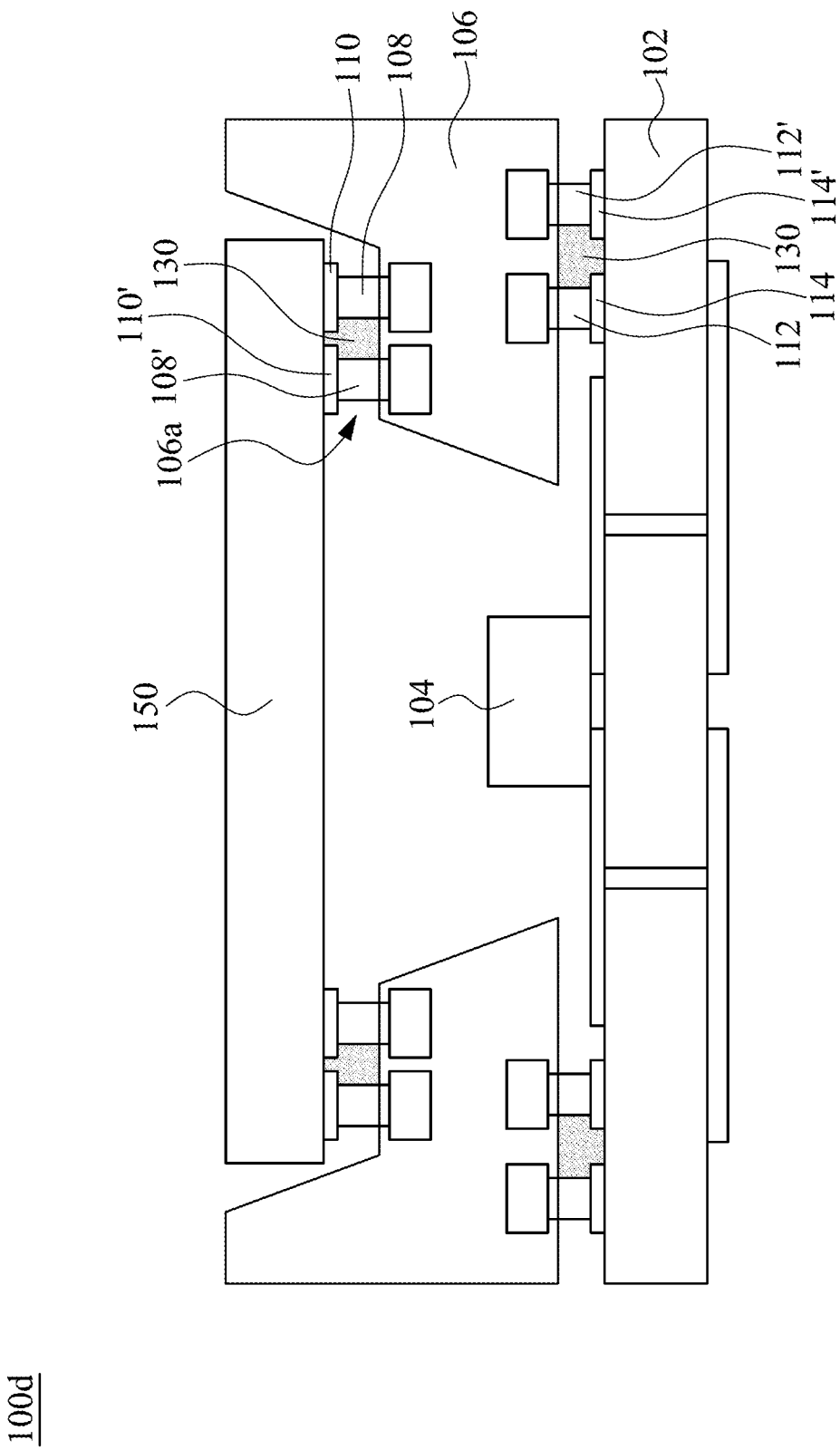
FIG. 4 illustrates a cross-sectional view of an LED package structure in accordance with a fourth embodiment of the present disclosure.

Reference is made to FIG. 4, which illustrates a cross-sectional view of an LED package structure in accordance with a fourth embodiment of the present disclosure. The difference between the LED package structure 100d and the aforementioned LED package structure 100b is the addition of another set of first, second, third, and fourth metal rings (108', 110', 112', 114'). In this embodiment, the diameter of the first and second metal rings (108', 110') is smaller than the diameter of the first and second metal rings (108, 110), and the diameter of the third and fourth metal rings (112', 114') is larger than the diameter of the third and fourth metal rings (112, 114), but not being limited thereto. When a polymer adhesive 130 is utilized to join metal rings in the LED package structure 100d, the polymer adhesive 130 can be filled between the first and second metal rings (108, 110, 108', 110') of different diameters and filled between the third and fourth metal rings (112, 114, 112', 114') of different diameters, in order to avoid the direct irradiation from the high-energy light emitted by the LED chip 104 to cause polymer deterioration.

Figure 5:
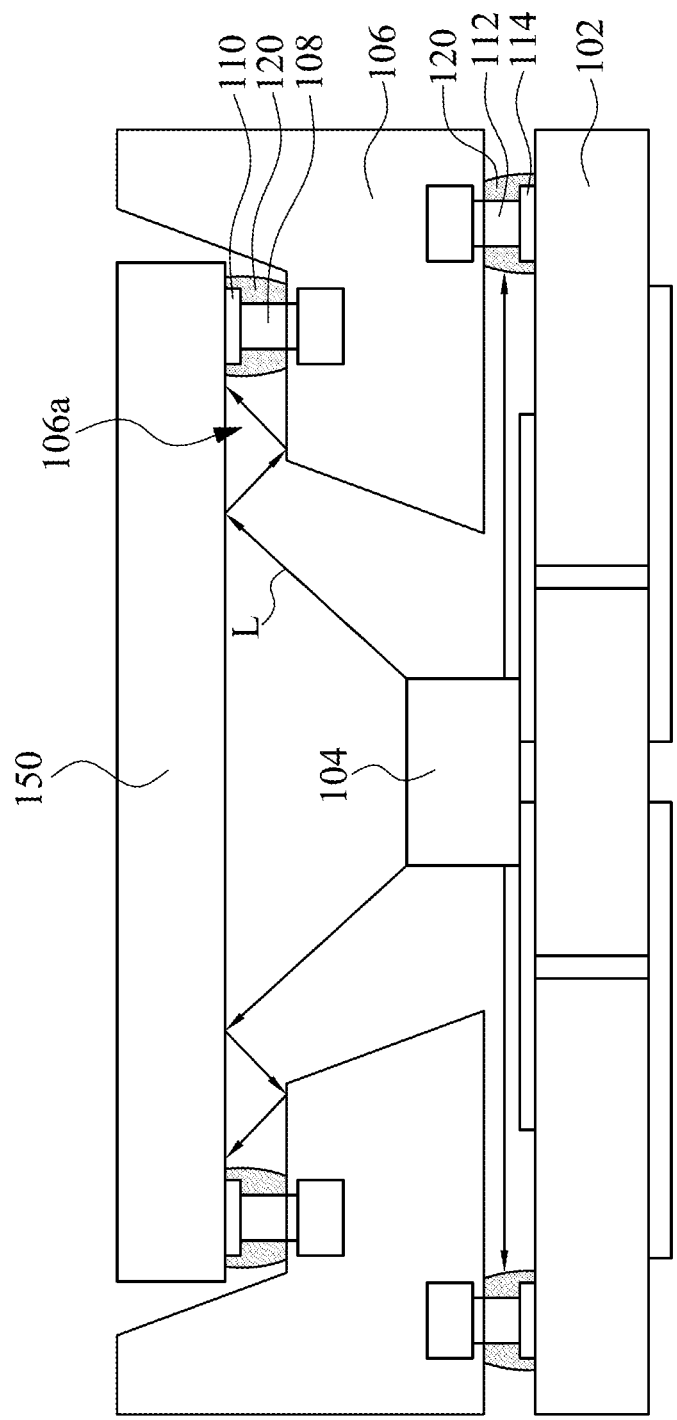
FIG. 5 illustrates a cross-sectional view of an LED package structure in accordance with a fifth embodiment of the present disclosure.

Reference is made to FIG. 5, which illustrates a cross-sectional view of an LED package structure in accordance with a fifth embodiment of the present disclosure. The LED package structure 100e specifically illustrates the specific structure of using the metal paste 120 to bond the metal rings. The advantage of using the metal paste 120 or other inorganic materials instead of organic polymer materials to join the metal rings is to prevent the organic polymer materials from being attacked by the high-energy light L emitted from the LED chip 104 and degraded.

Figure 6:
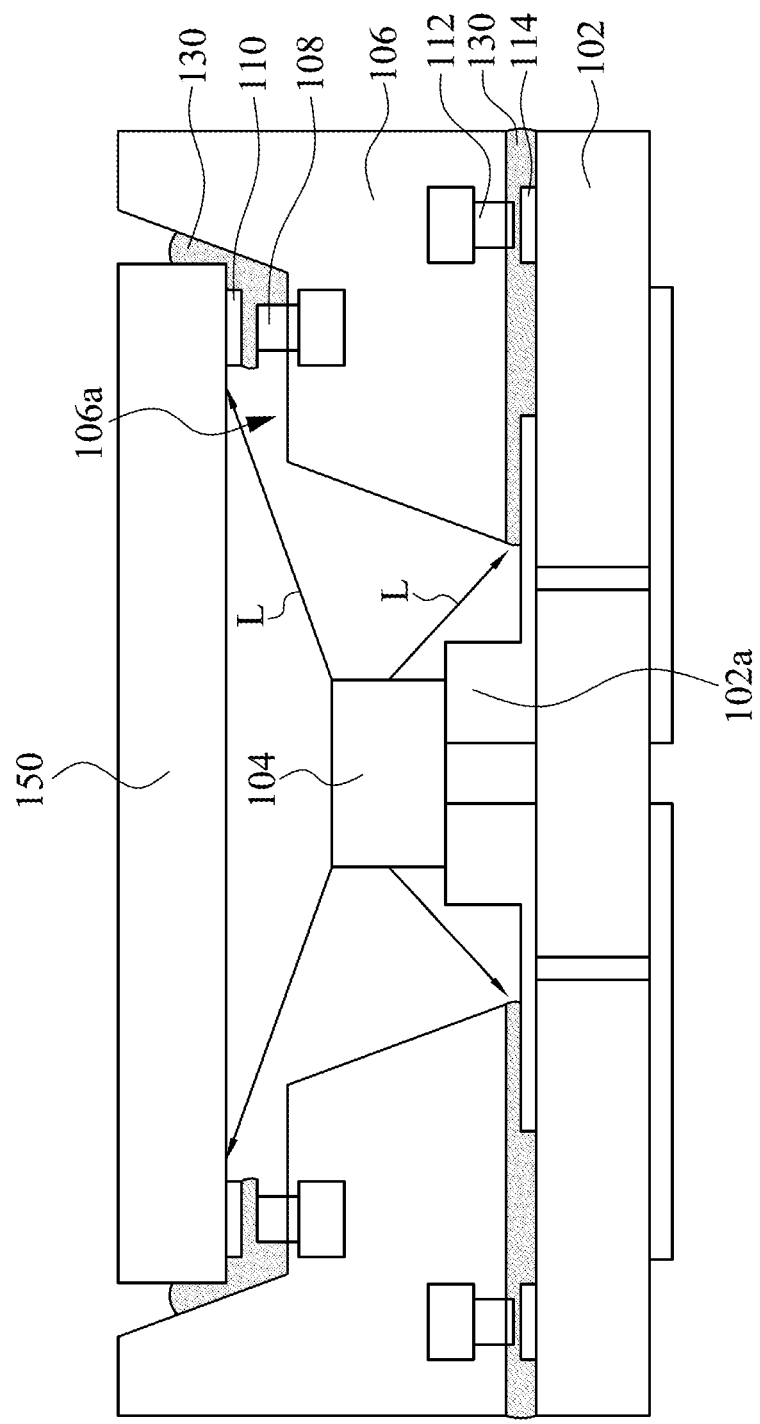
FIG. 6 illustrates a cross-sectional view of an LED package structure in accordance with a sixth embodiment of the present disclosure.

Reference is made to FIG. 6, which illustrates a cross-sectional view of an LED package structure in accordance with a sixth embodiment of the present disclosure. The circuit board 102 of the LED package structure 100f has a stage 102a on which the LED chip 104 can be die-bonded. A top surface of the stage 102a is higher than a junction interface between the reflective cup 106 and the circuit board 102. When a polymer adhesive 130 is utilized to join metal rings in the LED package structure 100f, a height of the stage 102a prevents the high-energy light L emitted by the LED chip 104 from directly irradiating the polymer adhesive 130. In addition, when the lens structure 150 is embedded on the stage 102a in the concave cup of the reflective cup 106, the polymer adhesive 130 can be filled between the first and second metal rings (108, 110) and the inner wall of the reflective cup 106, in order to increase the glued area.

Figure 7:
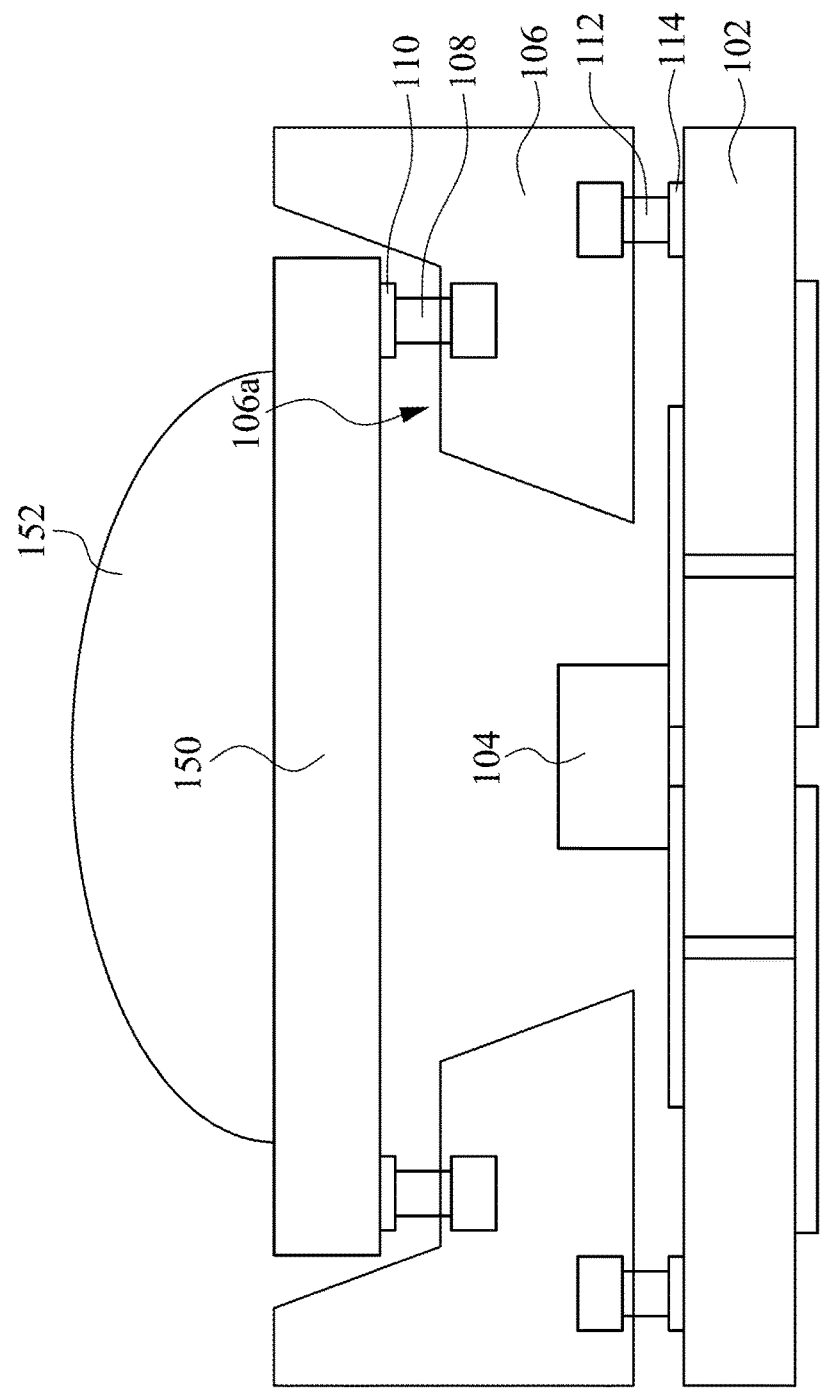
FIG. 7 illustrates a cross-sectional view of an LED package structure in accordance with a seventh embodiment of the present disclosure.

Reference is made to FIG. 7, which illustrates a cross-sectional view of an LED package structure in accordance with a seventh embodiment of the present disclosure. The difference between the LED package structure 100g and the aforementioned LED package structure 100b is that the lens structure 150 is a convex lens, which is different from the aforementioned flat lens.

Figure 8:
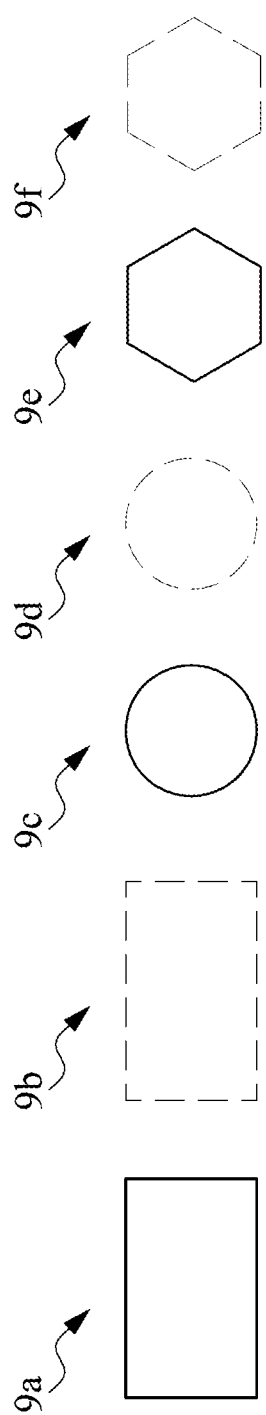
FIG. 8 illustrates plan views of various metal rings in LED package structures in accordance with embodiments of the present disclosure.

Reference is made to FIG. 8, which illustrates plan views of various metal rings in LED package structures in accordance with embodiments of the present disclosure. An outer shape of the metal ring may be a continuously closed rectangle 9a, a continuously closed circle 9c, or a continuously closed polygon 9e, or a discontinuous rectangle 9b, a discontinuous circle 9d, or a discontinuous polygon 9f, etc., but not being limited thereto.

In summary, the LED package structure disclosed herein adopts a multi-piece combination design and joins the components with metal rings to address the issue of uneven substrates and increase the eutectic bonding yield. The LED package structure can be applied to a variety of substrates and various types of permeable environments to increase design flexibility. In addition, the metal ring can prevent the bonding material from being attacked by the high-energy light of the LED.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode (LED) package structure comprising:
    a circuit board;
    a reflective cup disposed on the circuit board, wherein the reflective cup and the circuit board collectively form a concave cup having an opening, the reflective cup has a first metal ring in the concave cup;
    a LED chip disposed on the circuit board and within the concave cup; and
    a lens structure having a second metal ring configured to join the first metal ring to cover the opening, wherein a bottom surface of the reflective cup has a third metal ring, and the circuit board has a fourth metal ring configured to join the third metal ring.

2. The LED package structure of claim 1 further comprising a metal paste or a glass paste disposed between the first and second metal rings, and disposed between the third and fourth metal rings.

3. The LED package structure of claim 1 further comprising a polymer adhesive disposed between the first and second metal rings, and disposed between the third and fourth metal rings.

4. The LED package structure of claim 1, wherein the first metal ring and the third metal ring are connected to each other and have substantially the same diameter.

5. The LED package structure of claim 1, wherein the circuit board has a stage on which the LED chip is mounted, a top of the stage is higher than an interface between the reflective cup and the circuit board.

6. The LED package structure of claim 1, wherein the lens structure comprises a flat lens or a convex lens.

7. The LED package structure of claim 1, wherein the lens structure is embedded in the concave cup.

8. The LED package structure of claim 1, wherein the first, second, third and fourth metal rings are continuously closed metal rings.

9. The LED package structure of claim 1, wherein the first, second, third and fourth metal rings are discontinuous metal rings.

10. The LED package structure of claim 1, wherein an inner surface of the concave cup has a light reflective coating.

11. The LED package structure of claim 1 further comprising another pair of first and second metal rings with a different diameter configured to secure the lens structure to the reflective cup.

12. The LED package structure of claim 11 further comprising a polymer adhesive disposed between the another pair of first and second metal rings.

13. The LED package structure of claim 1 further comprising another pair of third and fourth metal rings with a different diameter configured to secure the reflective cup to the circuit board.

14. The LED package structure of claim 13 further comprising a polymer adhesive disposed between the another pair of third and fourth metal rings.

* * * * *